(12) United States Patent
Oritsuki et al.

(10) Patent No.: US 8,587,072 B2
(45) Date of Patent: Nov. 19, 2013

(54) SILICON CARBIDE SEMICONDUCTOR DEVICE

(75) Inventors: Yasunori Oritsuki, Tokyo (JP); Naoki Yutani, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 100 days.

(21) Appl. No.: 13/417,755

(22) Filed: Mar. 12, 2012

(65) Prior Publication Data

US 2013/0026494 A1    Jan. 31, 2013

(30) Foreign Application Priority Data

Jul. 25, 2011  (JP) .................. 2011-162204

(51) Int. Cl.
*H01L 23/62*    (2006.01)
*H01L 21/8238*  (2006.01)
(52) U.S. Cl.
USPC ........................ 257/358; 438/210
(58) Field of Classification Search
USPC ........... 257/154, 358, 379, 536; 438/210, 382
See application file for complete search history.

(56) References Cited

U.S. PATENT DOCUMENTS 8,012,844 B2 *  9/2011  Dirnecker et al. ............ 438/384

FOREIGN PATENT DOCUMENTS

JP           63-213370         9/1988

* cited by examiner

*Primary Examiner* — Calvin Lee
(74) *Attorney, Agent, or Firm* — Oblon, Spivak, McClelland, Maier & Neustadt, L.L.P.

(57) ABSTRACT

An SiC semiconductor device includes a semiconductor element formed in an SiC substrate, a source electrode and a gate pad formed by using an interconnect layer having barrier metal provided at the bottom surface thereof, and a temperature measuring resistive element formed by using part of the barrier metal in the interconnect line.

7 Claims, 6 Drawing Sheets

SILICON CARBIDE SEMICONDUCTOR DEVICE

BACKGROUND OF THE INVENTION

1. Field of the Invention

The present invention relates to a silicon carbide semiconductor device with a temperature detecting element.

2. Description of the Background Art

A semiconductor element using silicon carbide (SiC) is considered as a promising element to function as a next-generation switching element capable of realizing a high breakdown voltage, low loss, and high resistance to heat. Such a semiconductor element is expected to be applied in a power semiconductor device such as an inverter. However, a semiconductor device formed by using silicon carbide (silicon carbide semiconductor device) has problems remaining unsolved.

As an example, it is known that a temperature detecting element for use in control of the operation of a protection circuit is provided in a semiconductor device. If this semiconductor device is a conventional semiconductor device formed by using silicon (silicon semiconductor device), a diode made of polysilicon (polysilicon diode) is often used as the temperature detecting element. The polysilicon diode is formed by ion implantation of impurities (dopants) into a polysilicon film. In order to form the polysilicon diode on the silicon semiconductor device, ion implantation for forming a semiconductor element in a silicon substrate, and ion implantation for forming the polysilicon diode, may be performed at the same time, thereby minimizing increase of the number of manufacturing steps.

Meanwhile, manufacture of a silicon carbide semiconductor device requires ion implantation for forming a semiconductor element, and subsequent thermal processing at a temperature of 1500° C. or higher. So, in order to form a polysilicon diode for temperature detection on the silicon carbide semiconductor device, ion implantation for forming the semiconductor element, and ion implantation for forming the polysilicon diode, should be performed separately. This involves considerable increase of the number of steps, compared to manufacture of a conventional silicon semiconductor device.

Japanese Patent Application Laid-Open No. 63-213370 (1988) discloses a semiconductor device of a structure where an insulating layer having heat conductivity is formed on the source electrode of a power transistor, and a thin-film resistive element made of platinum or polysilicon is formed as a temperature detecting resistor on the insulating layer.

As described above, providing a polysilicon diode functioning as a temperature detecting element in a silicon carbide semiconductor device increases the number of manufacturing steps, leading to increase of manufacturing costs. Additionally, a silicon carbide semiconductor device is expected to operate under a high temperature, whereas a polysilicon diode is hard to operate under a high temperature of 200° C. or higher. So, a polysilicon diode cannot be used in a silicon carbide semiconductor device supposed to operate under a temperature of 200° C. or higher.

SUMMARY OF THE INVENTION

It is an object of the present invention to provide a silicon carbide semiconductor device which includes a temperature detecting element having excellent resistance to heat, and which can be formed by following a small number of steps.

The silicon carbide semiconductor device of the present invention includes a semiconductor element formed in a silicon carbide substrate, an interconnect layer formed on the silicon carbide substrate and having barrier metal provided at the bottom surface thereof, and a temperature measuring resistive element formed by using part of the barrier metal in the interconnect layer.

In the present invention, the temperature detecting element is not a polysilicon diode, but the temperature measuring resistive element formed by using part of the barrier metal. The temperature measuring resistive element can be used under a temperature higher than that for a polysilicon diode, so that it can be applied in the silicon carbide semiconductor device supposed to operate under a temperature (of 200° C. or higher). Also, unlike a polysilicon diode, the temperature measuring resistive element does not require ion implantation in a step of forming the temperature measuring resistive element. Further, the temperature measuring resistive element is formed by using part of the barrier metal provided to the bottom surface of the interconnect layer, minimizing increase of the number of manufacturing steps.

These and other objects, features, aspects and advantages of the present invention will become more apparent from the following detailed description of the present invention when taken in conjunction with the accompanying drawings.

EMBODIMENT FOR CARRYING OUT THE INVENTION

First Preferred Embodiment

Figure 1:
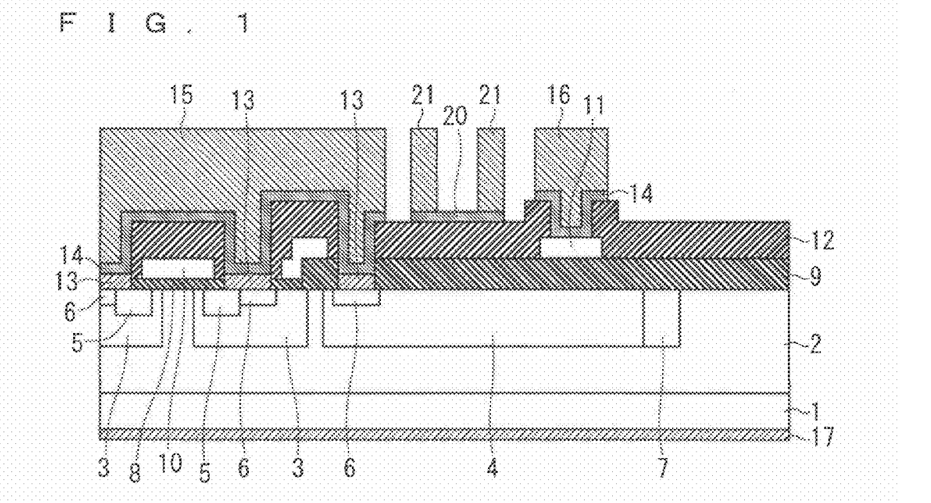
FIG. 1 is a sectional view showing the structure of a silicon carbide semiconductor device of a first preferred embodiment.

FIG. 1 is a sectional view showing the structure of a silicon carbide semiconductor device (hereinafter called an "SiC semiconductor device") of a first preferred embodiment. In the example given below, the SiC semiconductor device includes an MOSFET (metal-oxide semiconductor field-effect transistor) as a semiconductor element. The structure of the SiC semiconductor device is such that a plurality of MOSFET cells is provided, and a termination structure intended to relax electric field concentration is provided to surround a region in which the MOSFET cells are arranged. FIG. 1 shows an MOSFET cell on the outermost circumference of an active region, and a termination structure formed on the outer side of this MOSFET cell. In the below, a region in which the MOSFET cell is formed (left part of FIG. 1) is called an "active region," and a region in which the termination structure is formed (right part of FIG. 1) is called a "termination region."

As shown in FIG. 1, the SiC semiconductor device of the first preferred embodiment is formed by using an epitaxial substrate composed of an n$^+$-type SiC substrate 1 and an n$^-$-type epitaxial layer 2 grown on the SiC substrate 1.

P-type well regions (p-well regions) 3 are selectively formed in an upper surface portion of the epitaxial layer 2. N-type source regions 5 are formed in surface portions of the p-well regions 3.

In the termination region surrounding the active region in which the MOSFET cell is arranged, a p-type well region (termination p-well region) 4 functioning as part of the termination structure is formed in an upper surface portion of the epitaxial layer 2. A JTE (junction termination extension) region 7 which is a p-type region lower in impurity concentration than the termination p-well region 4 is formed on an outer circumferential portion on the outer side of the termination p-well region 4.

A gate oxide film 8 covering the active region, and a field oxide film 9 covering the termination region, are formed on the epitaxial layer 2. A gate electrode 10 is formed on the gate oxide film 8 such that the gate electrode 10 extends across adjacent ones of the p-well regions 3.

Part of the epitaxial layer 2 below the gate electrode 10 and adjacent to the p-well regions 3 (region placed between the adjacent p-well regions 3) is called a "JFET (junction field effect transistor) region." Regions below the gate electrode 10 and placed between the source regions 5 and the JFET region are called "channel regions" in which a channel is formed when the MOSFET is brought into a conducting state.

A gate interconnect line 11 is formed on the field oxide film 9. The gate interconnect line 11 is composed of the same interconnect layer as the gate electrode 10. The gate interconnect line 11 and the gate electrode 10 are connected in a region not shown. An interlayer insulating film 12 is formed on the gate electrode 10 and the gate interconnect line 11.

A source electrode (source pad) 15 functioning an electrode for external connection and a gate pad 16 are formed on the interlayer insulating film 12. The source electrode 15 and the gate pad 16 are formed by using the same interconnect layer. Barrier metal 14 is provided to the bottom surfaces of the source electrode 15 and the gate pad 16. A drain electrode 17 is provided to the rear surface (lower surface) of the SiC substrate 1.

The source electrode 15 is electrically connected through contact holes formed in the interlayer insulating film 12 to the source regions 5 and the p-well regions 3 in the MOSFET cell, and to the termination p-well region 4. P$^+$-type contact regions 6 connected to the source electrode 15 are formed in parts of the p-well regions 3 and the termination p-well region 4. Silicides 13 are formed in parts of the epitaxial layer 2 (upper surfaces of the source regions 5 and the contact regions 6) exposed to all the contact holes. The silicides 13 form connections between the source electrode 15 and the source regions 5, and between the source electrode 15 and the contact regions 6.

The gate pad 16 is connected through a contact hole formed in the interlayer insulating film 12 to the gate interconnect line 11.

The SiC semiconductor device of the first preferred embodiment includes a temperature measuring resistive element 20 functioning as a temperature detecting element and formed by using part of the barrier metal 14. Like the source electrode 15 and the gate pad 16, temperature sensing pads 21 connected to the temperature measuring resistive element 20 and which take a voltage out of the temperature measuring resistive element 20 are formed by using an interconnect layer provided with the barrier metal 14 on their bottom surfaces. The resistance value of the temperature measuring resistive element 20 changes depending on temperature. So, measuring the resistance value of the temperature measuring resistive element 20 by using the output voltage of the temperature measuring resistive element 20 appearing in the temperature sensing pads 21 makes it possible to detect the temperature of the SiC semiconductor device.

FIGS. 2 to 9 show steps of manufacturing the SiC semiconductor device of the first preferred embodiment. A method of manufacturing the SiC semiconductor device of the first preferred embodiment is described below by referring to FIGS. 2 to 9.

Figure 2:
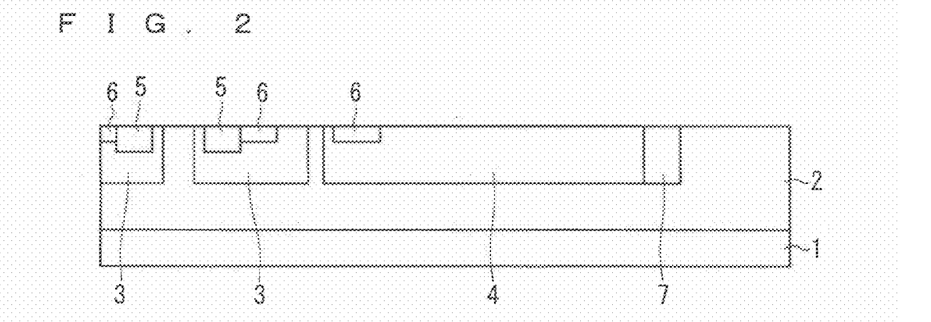
FIGS. 2 to 9 show steps of manufacturing the silicon carbide semiconductor device of the first preferred embodiment.

First, the epitaxial substrate which consists of the n$^+$-type SiC substrate 1 and the n-type epitaxial layer 2 provided on the n$^+$-type SiC substrate 1. Then, selective ion implantation using a mask patterned by photolithographic technique is performed to form the p-well regions 3, the termination p-well region 4, the n-type source regions 5, the p$^+$-type contact regions 6, and the JTE region 7 in the upper surface portion of the epitaxial layer 2 (FIG. 2). Regarding impurities to be implanted by ion implantation, nitrogen or phosphorus may be used as n-type impurities, and aluminum or boron may be used as p-type impurities.

Next, thermal processing at a temperature of 1500° C. or higher is performed to electrically activate the impurities implanted by the ion implantation, and to recover a crystal defect generated during the ion implantation.

Figure 3:
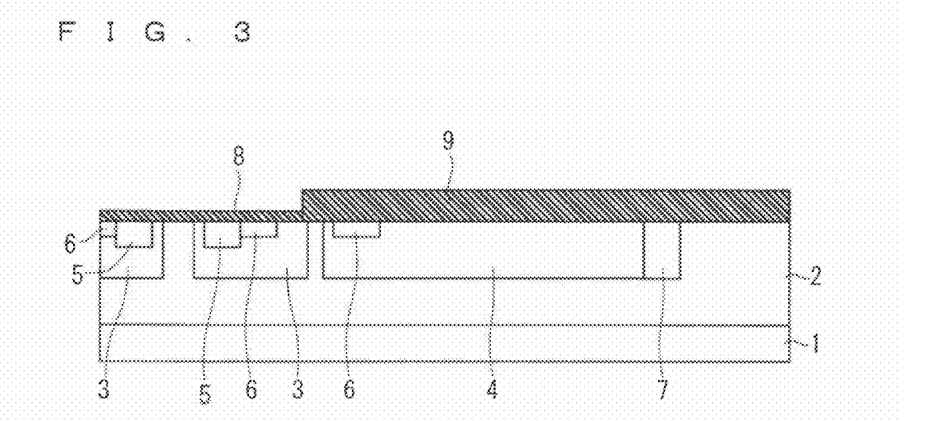

Then, a silicon oxide film is deposited on the epitaxial layer 2 for example by CVD (chemical vapor deposition) process and pattern the silicon oxide film, thereby forming the field oxide film 9 covering the epitaxial layer 2 in the termination region. A silicon oxide film is also formed on a surface of the epitaxial layer 2 in the active region for example by thermal oxidation process or deposition process, thereby forming the gate oxide film 8 (FIG. 3).

Figure 4:
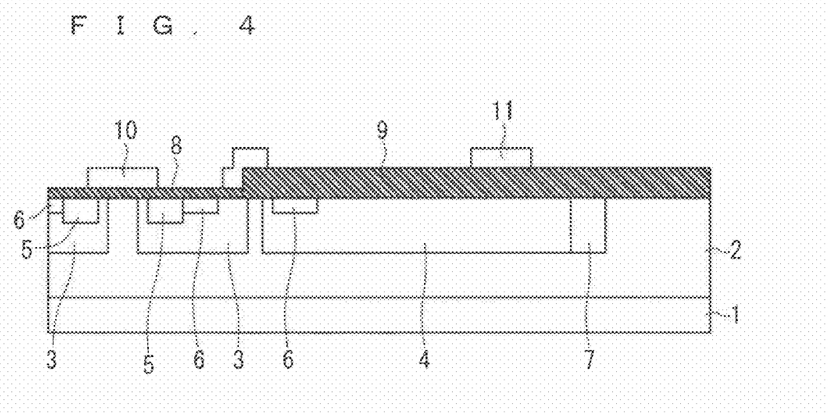

Next, a polysilicon film is deposited on the gate oxide film 8 and the field oxide film 9 for example by CVD process, and then the polysilicon film is patterned by selective etching using photolithographic technique, thereby forming the gate electrode 10 and the gate interconnect line 11 (FIG. 4).

Figure 5:
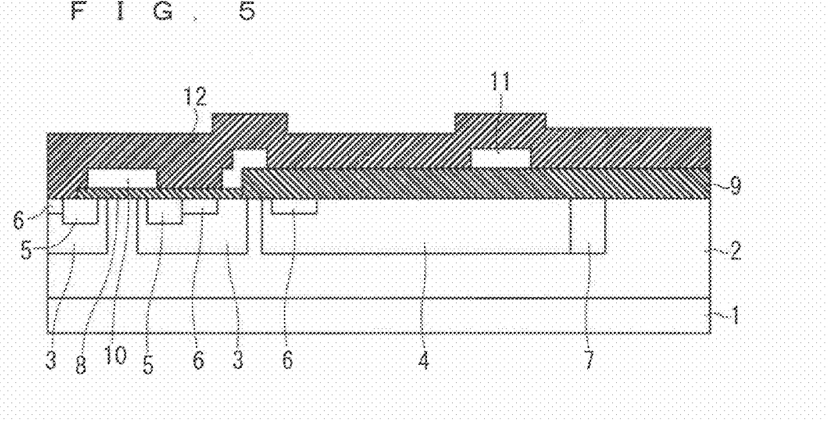

Next, the interlayer insulating film 12 is deposited for example by CVD process (FIG. 5). Selective etching is thereafter performed to form contact holes in the interlayer insulating film 12 to reach the upper surfaces of the source regions 5, and the respective upper surfaces of the contact regions 6 in the p-well regions 3 and in the termination p-well region 4.

Figure 6:
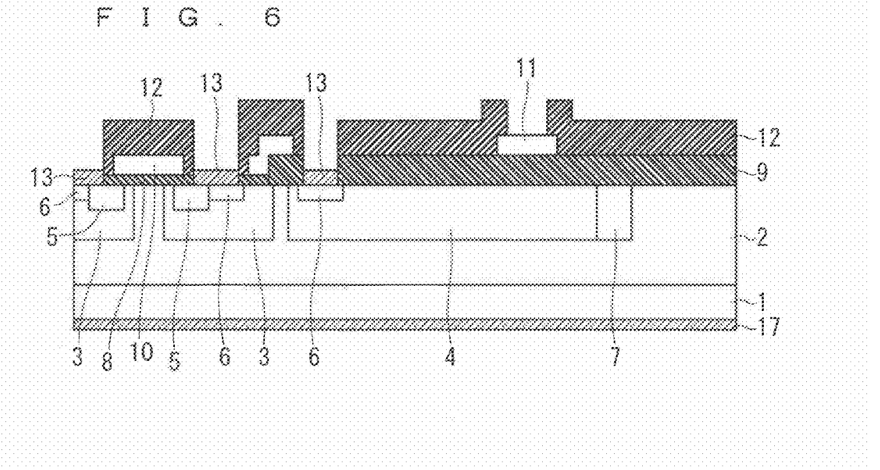

Then, the silicides 13 are formed on a surface of the epitaxial layer 2 exposed at the bottoms of the contact holes (on the source regions 5 and the contact regions 6). A silicide of the drain electrode 17 is formed simultaneously with, or before or after formation of the silicides 13. Thereafter, a contact hole reaching the upper surface of the gate interconnect line 11 is formed (FIG. 6). As a representative example of a technique of forming the silicides 13, a metal film (made of nickel, for example) is deposited on the entire surface including the inside of the contact holes, and then thermal processing is performed to make the metal film and silicon carbide react with each other to form the silicides 13. Part of the metal film remaining unreacted is removed thereafter.

Figure 7:
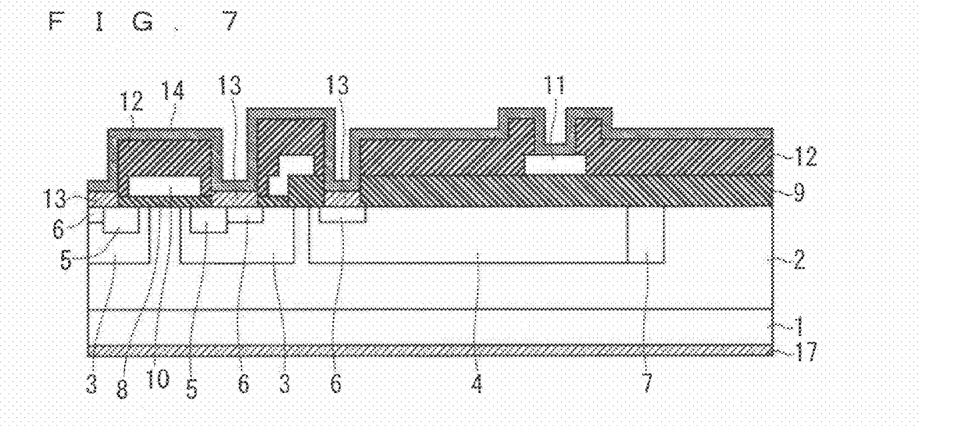
Figure 8:
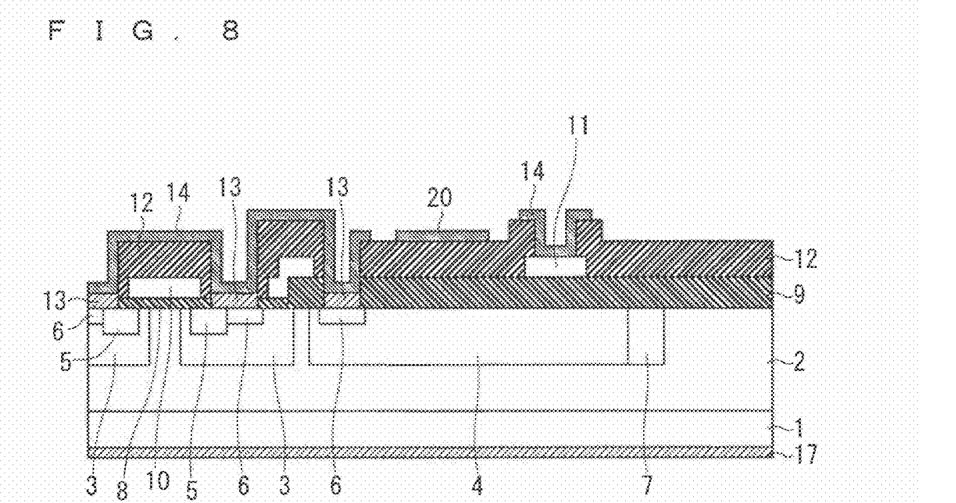

Next, the barrier metal 14 is formed inside the contact holes and on the interlayer insulating film 12 (FIG. 7). Then, selective etching is performed to pattern the barrier metal 14 according to the patterns of the source electrode 15 and the gate pad 16 to be formed subsequently. At this time, part of the barrier metal 14 is used to form the temperature measuring resistive element 20 functioning as a temperature detecting element (FIG. 8). The barrier metal 14 (temperature measuring resistive element 20) may be composed of a Ti film, a TiN film, a TiSi film, a TiSi/TiN film (stacked structure of TiSi and TiN), a TiSi/Ti film (stacked structure of TiSi and Ti), a TiN/Ti film (stacked structure of TiN and Ti), a TiSi/TiN/Ti film (stacked structure of TiSi, TiN and Ti), a Pt film, or the like.

Figure 9:
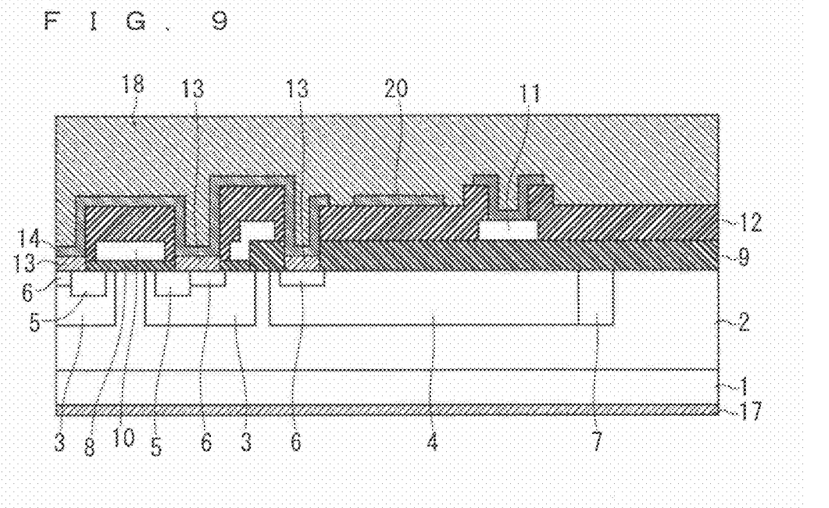

Next, an aluminum film 18 is formed on the interlayer insulating film 12 as well as on the inside of the contact holes (FIG. 9). Then, the aluminum film 18 is patterned to form the source electrode 15, the gate pad 16, and the temperature sensing pads 21.

the structure of the SiC semiconductor device shown in FIG. 1 is completed by following the aforementioned steps. Although not shown in FIG. 1, the upper surface of the SiC semiconductor device is covered with a protective film (made of polyimide, for example). Meanwhile, the source electrode 15, the gate pad 16, and the temperature sensing pads 21 function as pads for external connection. So, openings to expose the upper surfaces of the source electrode 15, the gate pad 16, and the temperature sensing pads 21 are formed in the protective film.

As described above, a temperature detecting element provided in the SiC semiconductor device of the first preferred embodiment is not a polysilicon diode, but the temperature measuring resistive element 20 formed by using part of the barrier metal 14. The temperature measuring resistive element 20 can be used under a temperature higher than that for a polysilicon diode, so that it can be applied in an SiC semiconductor device supposed to operate under a high temperature (of 200° C. or higher).

Unlike a polysilicon diode, the temperature measuring resistive element 20 does not require ion implantation in a step of forming the temperature measuring resistive element 20. Further, the temperature measuring resistive element 20 is formed by using part of the barrier metal 14 provided to the bottom surfaces of the source electrode 15 and the gate pad 16. Thus, the first preferred embodiment minimizes increase of the number of manufacturing steps.

In a conventional semiconductor device that does not include the temperature measuring resistive element 20, for example, barrier metal is required to remain only on the bottom surfaces of a source electrode and a gate pad. So, the barrier metal is generally patterned simultaneously with an interconnect layer (corresponding to the aluminum film 18) formed on the barrier metal. In contrast, in the present invention, the temperature sensing pads 21 should be formed on part (opposite ends) of the temperature measuring resistive element 20 made of the barrier metal 14, so the aluminum film 18 and the barrier metal 14 should be formed in different steps. To be specific, the patterning step shown in FIG. 8 is required. This involves only one additional patterning step, but does not involve addition of any other step.

A polysilicon diode, if it is to be used as a temperature detecting element, is formed in a step of depositing a polysilicon film, a step of ion implantation, a patterning process and others that should be performed separately. (The reason therefor is that, in the manufacture of an SiC semiconductor device, ion implantation for forming a semiconductor element, and ion implantation for forming a polysilicon diode cannot be performed at the same time as described above.) So, use of a polysilicon diode as a temperature detecting element involves a larger number of steps than that of the present invention.

In the first preferred embodiment, an MOSFET is provided as a semiconductor element, and the JTE region is provided in the termination region. However, these are not the only structures of the semiconductor element and the termination region of the SiC semiconductor device of the present invention. As an example, the semiconductor element may be an IGBT (insulated gate bipolar transistor), a pn junction diode, a Shottky barrier diode, or a thyristor, and an FLR (field limiting ring) may be provided in place of the JTE region 7 in the termination region, which is also applied to each of embodiments described next.

Second Preferred Embodiment

Figure 10:
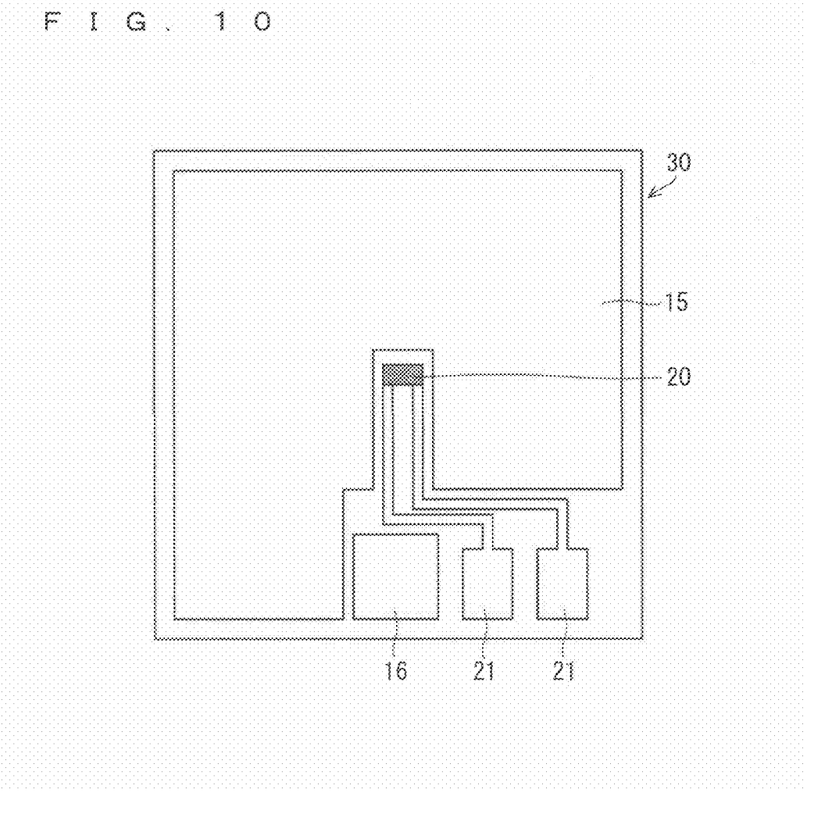
FIG. 10 is a top view showing the layout of a temperature measuring resistive element of a silicon carbide semiconductor device of a second preferred embodiment.

FIG. 10 is a top view of a chip 30 of an SiC semiconductor device of a second preferred embodiment, and shows the layout of a temperature measuring resistive element 20. Elements shown in FIG. 10 corresponding to those of FIG. 1 are identified by the same reference numbers.

As shown in FIG. 10, a source electrode 15, a gate pad 16, the temperature measuring resistive element 20, and temperature sensing pads 21 are formed in the upper surface of the chip 30 (a protective film is not shown). In the second preferred embodiment, the temperature measuring resistive element 20 is arranged in a central portion of the chip 30 of the SiC semiconductor device. Interconnect lines extending from the temperature sensing pads 21 to the temperature measuring resistive element 20 are composed of the same interconnect layer as the temperature sensing pads 21.

Generally, the temperature of a central portion of a chip of a semiconductor device increases to the highest level. Placing the temperature measuring resistive element 20 in the central portion makes it possible to quickly detect temperature increase of the SiC semiconductor device generated by an abnormality such as flow of an overcurrent, thereby protecting the semiconductor device reliably.

The source electrode 15, the gate pad 16, and the temperature sensing pads 21 do not always have the shapes shown in FIG. 10, and are not always provided in the numbers and in the positions shown in FIG. 10. The shapes, the numbers and the positions thereof may be changed in various ways depending on a product. Further, more temperature measuring resistive elements 20 and more temperature sensing pads 21 may be provided where appropriate. These are applied to each of embodiments described next.

Third Preferred Embodiment

Figure 11:
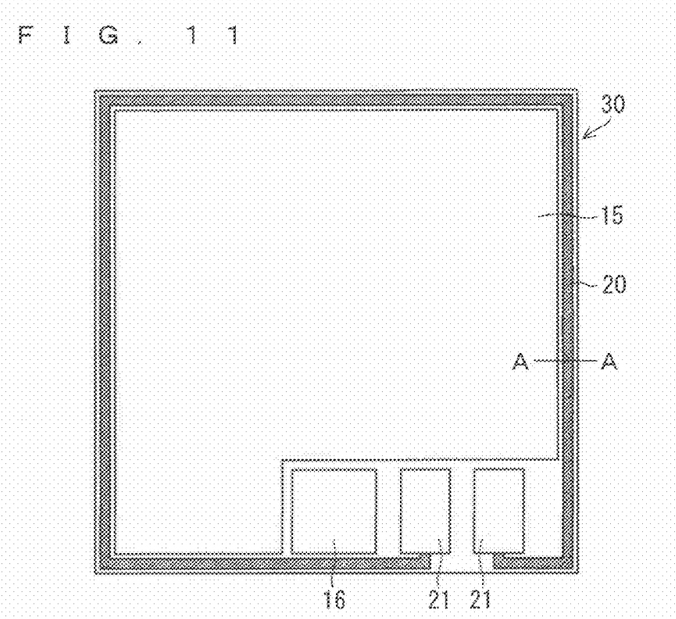
FIG. 11 is a top view showing the layout of a temperature measuring resistive element of a semiconductor device of a third preferred embodiment.

FIG. 11 is a top view of a chip 30 of an SiC semiconductor device of a third preferred embodiment, and shows the layout of a temperature measuring resistive element 20. Elements shown in FIG. 11 corresponding to those of FIG. 1 are also identified by the same reference numbers.

In the third preferred embodiment, a temperature measuring resistive element 20 is provided in an invalid region (region where no current flows) on an outer circumferential portion of the chip 30 of the SiC semiconductor device. Further, the temperature measuring resistive element 20 extends to surround an active region of the chip 30 (the invalid region includes a termination region).

Figure 12:
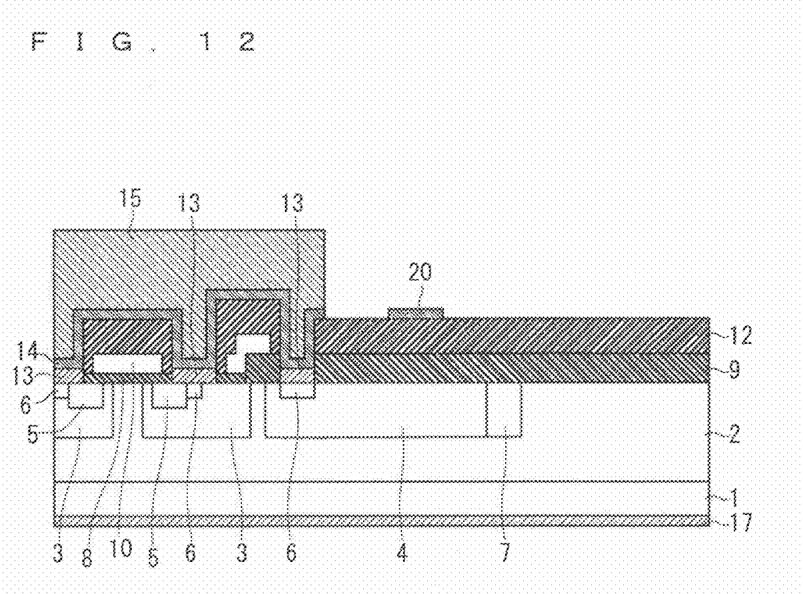
FIG. 12 is a sectional view showing the layout of the temperature measuring resistive element of the semiconductor device of the third preferred embodiment.

FIG. 12 is a sectional view showing the layout of the temperature measuring resistive element 20 of the third preferred embodiment, and corresponding to a cross section taken along line A-A of FIG. 11. As shown in FIG. 12, the temperature measuring resistive element 20 is provided above a termination p-well region 4 forming part of a termination structure. A field oxide film 9 and an interlayer insulating film 12 is provided between the termination p-well region 4 and the temperature measuring resistive element 20.

Extending the temperature measuring resistive element 20 to surround the active region of the chip 30 as shown in FIG. 11 can make the temperature measuring resistive element 20 longer. The resistance value of the temperature measuring resistive element 20 is in proportion to the length thereof. So, making the temperature measuring resistive element 20 longer can reduce a current to a low level that is caused to flow in the temperature measuring resistive element 20 in order to obtain an output voltage of a specific magnitude from the temperature measuring resistive element 20.

Meanwhile, making the temperature measuring resistive element 20 longer requires a large area for the temperature measuring resistive element 20, so the area of an electrically conductive region (active region) of the chip 30, namely an effective area may be reduced accordingly. In the third preferred embodiment, however, a region for the temperature measuring resistive element 20 is reserved in the invalid region on the outer circumferential portion of the chip 30. So, the effective area of the chip 30 is not required to be reduced, making it possible to reduce the entire area of the chip 30. In particular, the unit price of an SiC substrate is high, so this works effectively to reduce manufacturing costs of an SiC semiconductor substrate.

Fourth Preferred Embodiment

In a fourth preferred embodiment, a temperature measuring resistive element 20 has a function of a field plate forming part of a termination structure. The layout of the temperature measuring resistive element 20 of the fourth preferred embodiment is the same as that of FIG. 11. To be specific, the temperature measuring resistive element 20 is provided in an invalid region to surround an active region of a chip 30.

Figure 13:
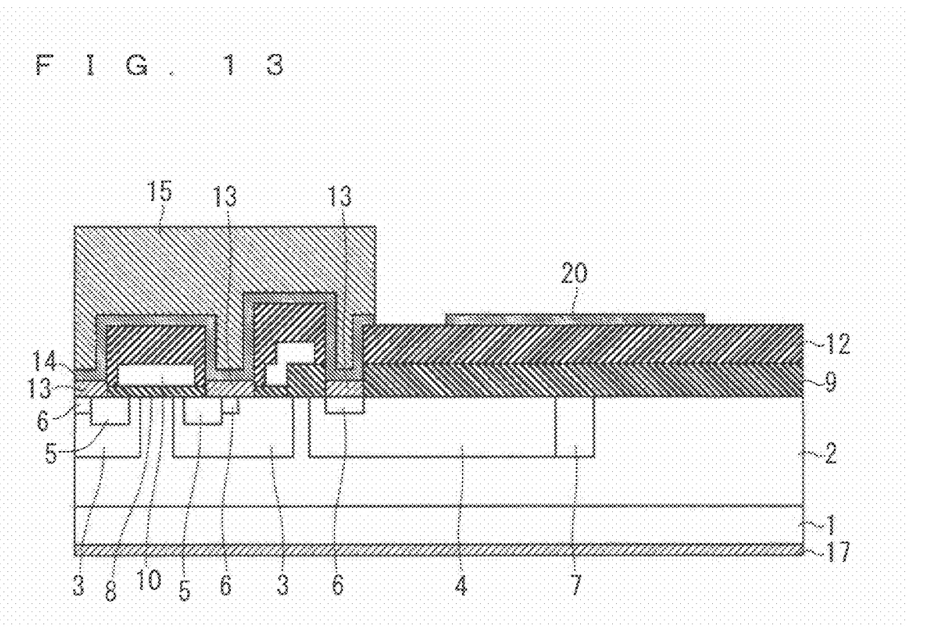
FIG. 13 is a sectional view showing the layout of a temperature measuring resistive element of a semiconductor device of a fourth preferred embodiment.

FIG. 13 is a sectional view showing the layout of the temperature measuring resistive element 20 of the fourth preferred embodiment, and corresponds to a cross section taken along line A-A of FIG. 11. As shown in FIG. 13, the temperature measuring resistive element 20 is provided to extend over an outer circumferential portion (portion where a JTE region 7 is formed) of a termination p-well region 4 of a termination structure. To be specific, the temperature measuring resistive element 20 is provided above a termination portion of a pn junction (portion of the pn junction in the upper surface of an epitaxial layer 2) formed by the termination p-well region 4 and the JTE region 7. A field oxide film 9 and an interlayer insulating film 12 is provided between the epitaxial layer 2 in which the termination p-well region 4 and the JTE region 7 are formed, and the temperature measuring resistive element 20.

The potential of the temperature measuring resistive element 20 is determined independently of the chip 30, and may be set at any value as long as this value allows the temperature measuring resistive element 20 to function as a field plate. As an example, the potential of the temperature measuring resistive element 20 may be set at a floating potential. Strictly speaking, a current is caused to flow in the temperature measuring resistive element 20 in order to obtain the output voltage of the temperature measuring resistive element 20, thereby generating a potential difference of about some volts across the temperature measuring resistive element 20. Meanwhile, a high voltage (of several hundreds volts) is supposed to be applied to the chip 30 of a power semiconductor device, so the potential difference across the temperature measuring resistive element 20 is considered as ignorable (considered to exert substantially no effect on the operation of the field plate).

In the fourth preferred embodiment, the temperature measuring resistive element 20 functions as a field plate, and electric field effect achieved by the field plate relaxes electric field concentration generated in the outer circumferential portion of the termination p-well region 4. This stabilizes the breakdown characteristics of a semiconductor device to enhance the reliability of the semiconductor device.

In the fourth preferred embodiment, the temperature measuring resistive element 20 is also formed to surround the active region of the chip 30 and to extend in the invalid region, thereby achieving the same effect as that achieved by the third preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A silicon carbide semiconductor device, comprising:
   a semiconductor element formed in a silicon carbide substrate;
   an interconnect layer formed on said silicon carbide substrate and having barrier metal provided at the bottom surface thereof; and
   a temperature measuring resistive element formed by using part of said barrier metal in said interconnect layer.

2. The silicon carbide semiconductor device according to claim 1, wherein said temperature measuring resistive element is arranged in a central portion of a chip of said silicon carbide semiconductor device as viewed in plan view.

3. The silicon carbide semiconductor device according to claim 1, wherein said temperature measuring resistive element is arranged in a region on an outer circumferential portion of a chip of said silicon carbide semiconductor device as viewed in plan view, the region being a region where no current flows.

4. The silicon carbide semiconductor device according to claim 1, wherein said temperature measuring resistive element is arranged to surround an active region in which said semiconductor element is formed as viewed in plan view.

5. The silicon carbide semiconductor device according to claim 4, wherein said temperature measuring resistive element is arranged in a termination region on the outer side of said semiconductor element, said temperature measuring resistive element functioning as a field plate.

6. The silicon carbide semiconductor device according to claim 1, wherein a pad for taking an output voltage out of said temperature measuring resistive element is formed by using said interconnect layer.

7. The silicon carbide semiconductor device according to claim 1, wherein said barrier metal is any one of a Ti film, a TiN film, a TiSi film, a TiSi/TiN film, a TiSi/Ti film, a TiN/Ti film, a TiSi/TiN/Ti film, and a Pt film.

* * * * *